United States Patent [19]

Kenney et al.

[11] Patent Number: 5,008,563
[45] Date of Patent: Apr. 16, 1991

[54] ADJUSTABLE CLOCK GENERATOR CIRCUIT

[75] Inventors: Timothy J. Kenney, Pittsford; Lionel J. D'Luna, Rochester, both of N.Y.

[73] Assignee: Eastman Kodak Company, Rochester, N.Y.

[21] Appl. No.: 402,585

[22] Filed: Sep. 5, 1989

[51] Int. Cl.$^5$ .................... H03K 3/284; H03K 5/13; H03K 3/017
[52] U.S. Cl. .................... 307/269; 307/273; 307/265; 307/517; 307/262
[58] Field of Search ............ 307/269, 601, 265, 290, 307/234, 272.1, 480, 273, 517, 262

[56] References Cited

U.S. PATENT DOCUMENTS

| | | | |
|---|---|---|---|
| 3,522,454 | 8/1970 | Gilmour | 307/601 |
| 3,790,821 | 2/1974 | Adamson | 307/273 |
| 4,675,546 | 6/1987 | Shaw | 307/601 |
| 4,685,103 | 8/1987 | Black | 307/273 |
| 4,797,575 | 1/1989 | Lofgren | 307/272.1 |
| 4,866,310 | 12/1989 | Ando et al. | 307/480 |
| 4,929,849 | 5/1990 | Paul | 307/269 |
| 4,929,850 | 5/1990 | Breuninger | 307/269 |
| 4,940,904 | 7/1990 | Lin | 307/269 |
| 4,965,465 | 10/1990 | Denda | 307/269 |

*Primary Examiner*—Stanley D. Miller
*Assistant Examiner*—Toan Tran
*Attorney, Agent, or Firm*—Edward Dugas

[57] ABSTRACT

A clock generator for producing a pulse that can be adjusted in width and position. The positive edge of an incoming clock signal is slowed by an adjustable rise time inverter with a selected bias voltage until a selected threshold voltage level is met by a Schmitt trigger. The output from the Schmitt trigger is directed through a similar delay circuit to establish the pulse width of the pulse.

4 Claims, 5 Drawing Sheets

ADJUSTABLE CLOCK GENERATOR CIRCUIT

TECHNICAL FIELD OF THE INVENTION

The present invention is related to clock generator circuits and, more particularly, to a clock generator for generating a pulse that can be adjusted in width and position.

BACKGROUND OF THE INVENTION

The present circuit was designed to integrate the clock generator function into a die with a correlated double sampling circuit. The problem prior to this design was that there was a timing mismatch between the clock connected to CMOS transmission gates used in the sample and hold circuit and there was an inability to re-position the clamp and sample pulses to eliminate clock feed through.

SUMMARY OF THE INVENTION

In the preferred embodiment of the adjustable clock generator circuit there is provided, a flip-flop having a clock input, a clear input, and complementary outputs. A first adjustable rise time inverter is used to receive a phasing input signal and a first bias voltage for controlling the rise time of its output signal. A first trigger device having an input connected to the first adjustable rise time inverter and an output connected to the clock input of the flip-flop, is responsive to the output signal for providing a pulse transition when the output signal reaches a trigger voltage.

A second adjustable rise time inverter having an input connected to one output of the flip-flop and an input connected to a second bias voltage provides second output signal having a rise time controlled by the second bias voltage.

A second trigger device having an input connected to the output of the second adjustable rise time inverter and an output connected to the clear input of the flip-flop provides a signal transition when the second output signal reaches a trigger voltage, thereby causing signals to appear on the complementary outputs of the flip-flop with said signals having a pulse position controlled by the level of the first bias voltage and a width controlled by the level of the second bias voltage.

From the foregoing, it can be seen that it is a primary object of the present invention to provide an improved adjustable clock generator circuit.

It is another object of the present invention to provide a clock generator circuit wherein output pulse position and width is adjustable.

These and other objects of the present invention will become more apparent when taken in conjunction with the following descriptions and drawings wherein like characters indicate like parts and which drawings form a part of the present application.

DESCRIPTION OF THE PREFERRED EMBODIMENT

Figure 1A:
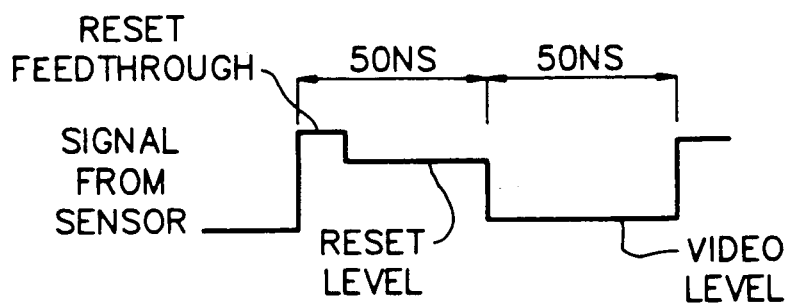
FIGS. 1A and 1B each illustrate a waveform useful in understanding the operation of the present invention.
Figure 1B:
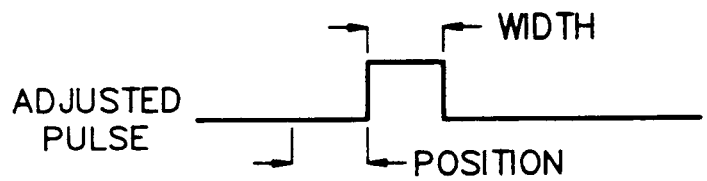

The circuit of the present invention has particular utility when used with image sensors of the type manufactured by Eastman Kodak Co. under their part designation KAI-0280. The output signal from such a sensor which is the input signal to the present circuit is illustrated in FIG. 1A with a pixel width of 100 ns. The signal waveform has three portions-a reset feed through, a reset level, and a video level portion. The present circuit operates in response to this signal to provide an adjustable output pulse having a settable pulse width of up to 50 ns and a delay of up to 100 ns. The adjustable pulse output of the present circuit is shown in FIG. 1B.

Figure 2:
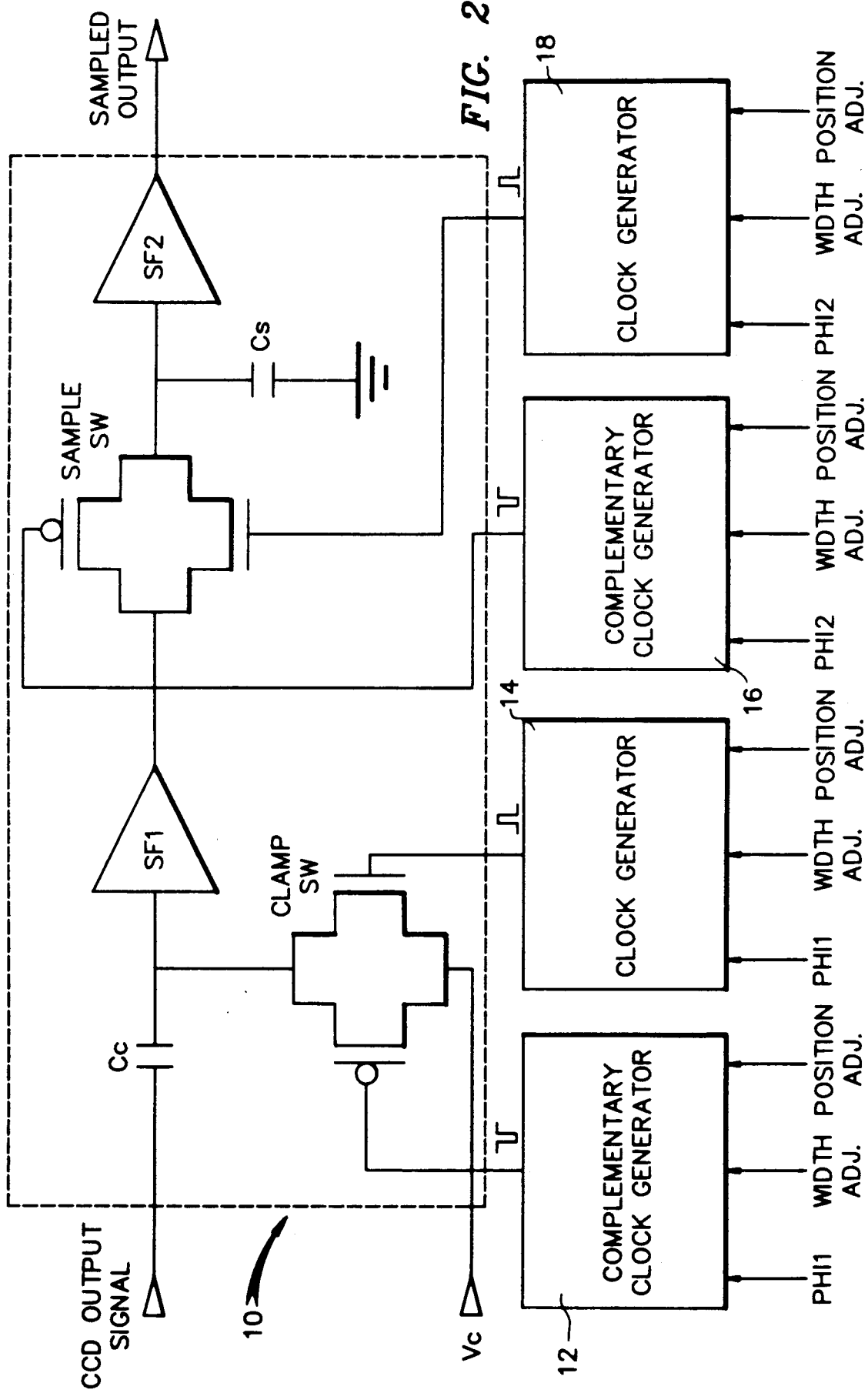
FIG. 2 is a schematic block diagram illustrating four clock generators coupled to a Correlated Double Sampling Circuit.

Referring to FIG. 2, a Correlated Double Sampling Circuit (CDS) 10 is a circuit which takes a CCD output signal from an image sensor and eliminates noise from the signal and forms a continuous video signal. The CDS circuit is comprised of two capacitors Cc and Cs, two switches (CLAMP SW and SAMPLE SW) and two source followers SF1 and SF2. In operation of the circuit of FIG. 2, the clamp switch, CLAMP SW, is closed during the reset level of the sensor signal. And the clamp capacitor Cc is charged to the voltage Vc. After opening the clamp switch, CLAMP SW, the voltage in the clamp capacitor Cc remains equal to the voltage Vc. The output of the first source follower SF1 is then equal to the voltage across the clamp capacitor Cc minus the reset level of the sensor output signal minus the Vgs voltage of the first source follower SF1 which now equals the new reset level. After the video level portion of the sensor signal comes through, the output of the first source follower SF1 is now the voltage across the clamp capacitor Cc minus the video level minus the Vgs of the first source follower SF1. During the video level portion of the sensor signal, the sampling switch, SAMPLE SW, is closed to cause the sample capacitor Cs to charge up to a voltage equal to the output of the first source follower SF1. After the SAMPLE SW is opened, the sample capacitor Cs holds the charge equal to the video minus the reset level. Therefore, the output of the second source follower SF2 is the amplitude equal to the difference between the video level and the reset level. The amplitude indicates the intensity of light received at a sensor pixel. So, the sample output waveform of the CDS circuit 10 is continuous and stepped with an amplitude of each pixels' light intensity.

To adjust the skew of the signals driving the clamp and sample switches and to adjust the width of the pulses two complementary clock generators, 12 and 16 are used to control the PMOSFET portion of the CLAMP SW and the SAMPLE SW, respectively. Two clock generators 14 and 18 are used to control the NMOSFET portion of the CLAMP SW and the SAMPLE SW, respectively. Each clock generator receives a phasing signal PH11 or PH12, a width adjustment signal and a position adjustment signal. In the embodiment of FIG. 2, skews can be eliminated if the positioning of pulses can be adjusted.

Figure 3:
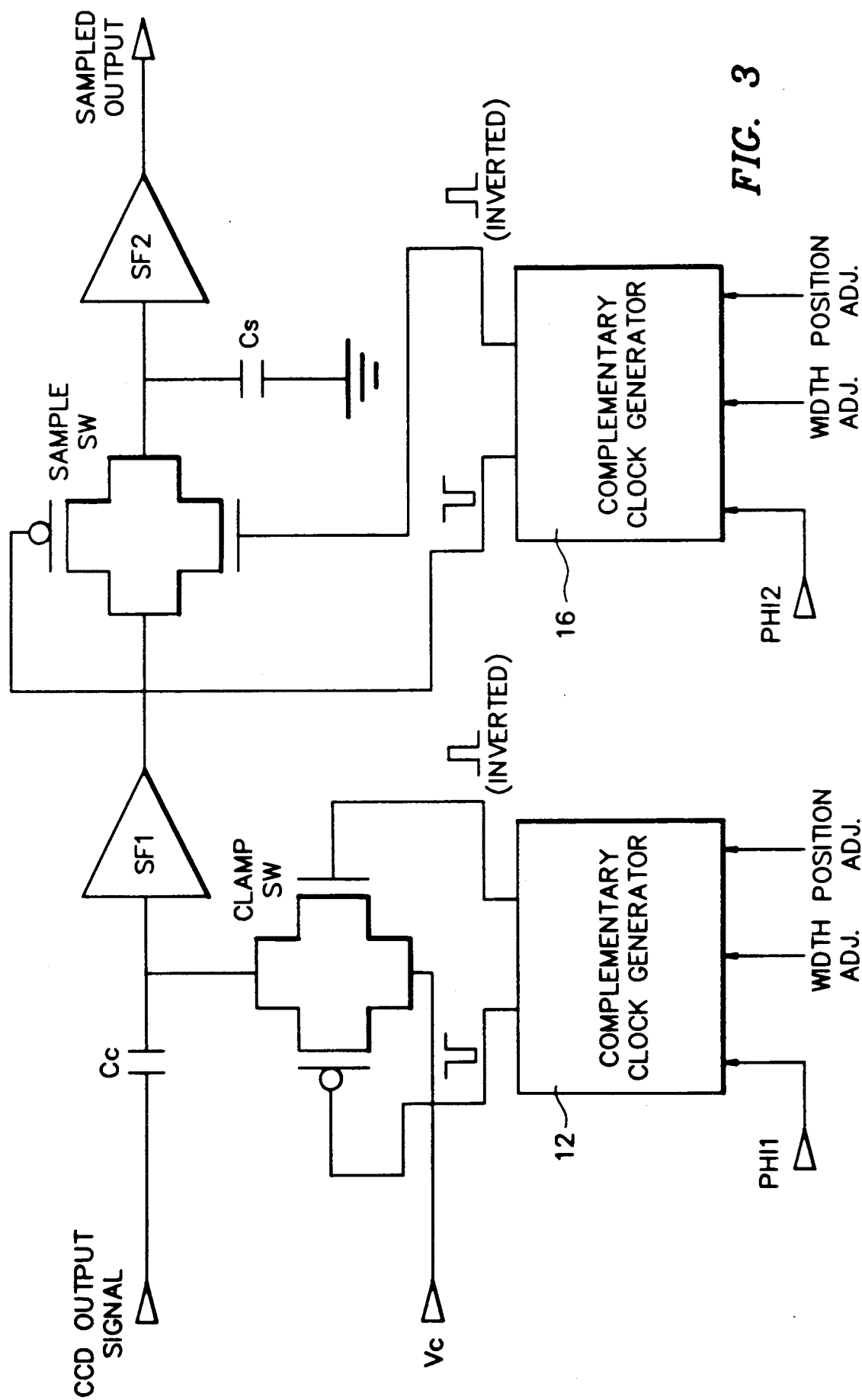
FIG. 3 is a schematic block diagram illustrating two clock generators coupled to a correlated Double Sampling Circuit.

If the skew problem is minimal or non-existent then the circuit embodiment of FIG. 3 can be used. In that embodiment the complementary clock generators provide the pulses to the NMOSFET and the PMOSFET, thereby eliminating the need for the clock generators 14 and 18. Although the clock generators have been shown in conjunction with a CDS circuit it will be obvious that other applications of the present embodiments are possible.

Figure 4:
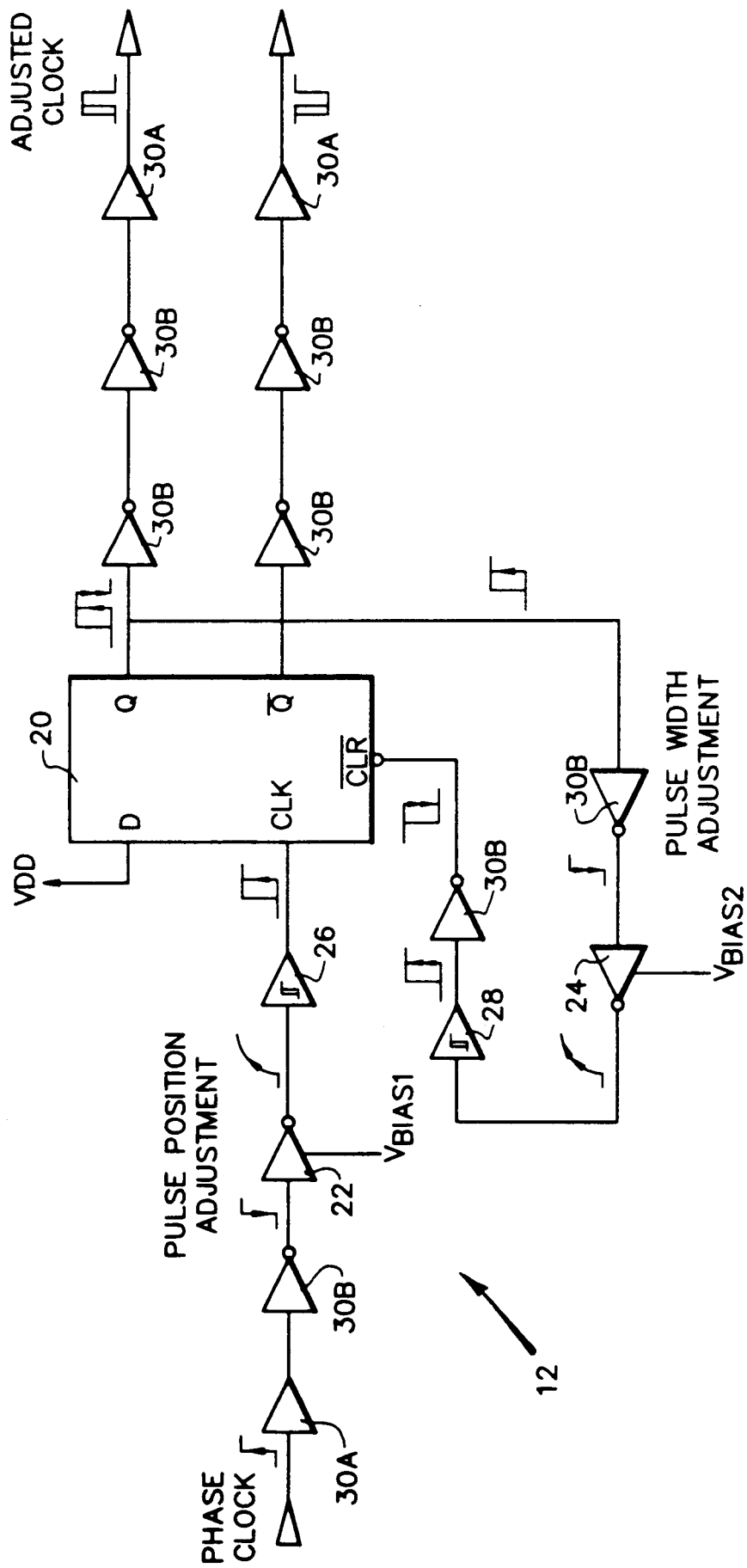
FIG. 4 is a schematic diagram of the preferred embodiment of the invention.

FIG. 4 illustrates in schematic diagram form the circuits that are used to form the clock generator 12. Clock generators 12, 14, 16 and 18 are identical in construction. A clock generator is comprised of a D-type flip-flop 20, two adjustable rise time inverters 22 and 24, two Schmitt triggers 26 and 28 and a plurality of two inverter types 30A and 30B. For positioning a pulse, the positive edge of the incoming phasing signal is slowed by the adjustable rise time inverter 22, after passing through inverter 30A and 30B. This is accomplished with a bias voltage VBIAS 1. When a threshold voltage level is met by the Schmitt trigger 26, the Schmitt trigger 26 produces a sharp, delayed rising edge to the CLK input of the D-type flip-flop 20. The output signal Q from the flip-flop 20 goes through an inverter 30B, an adjustable rise time inverter 24, a Schmitt trigger 28 and another inverter 30B for setting a pulse width and then clears the flip-flop 20 itself, creating the falling edge of the output. The Q and the Q̄ outputs are each passed through a pair of inverters 30B and an amplifier 30A to provide the adjusted clock signal and its complement. That is when a width of a pulse is set, and the output pulse has been formed in the desired position and width. If the complement (inverted) signals are used, such as in the application shown in FIG. 3, it is obtained by using the Q̄ output of the D-type flip-flop 20.

Figure 5:
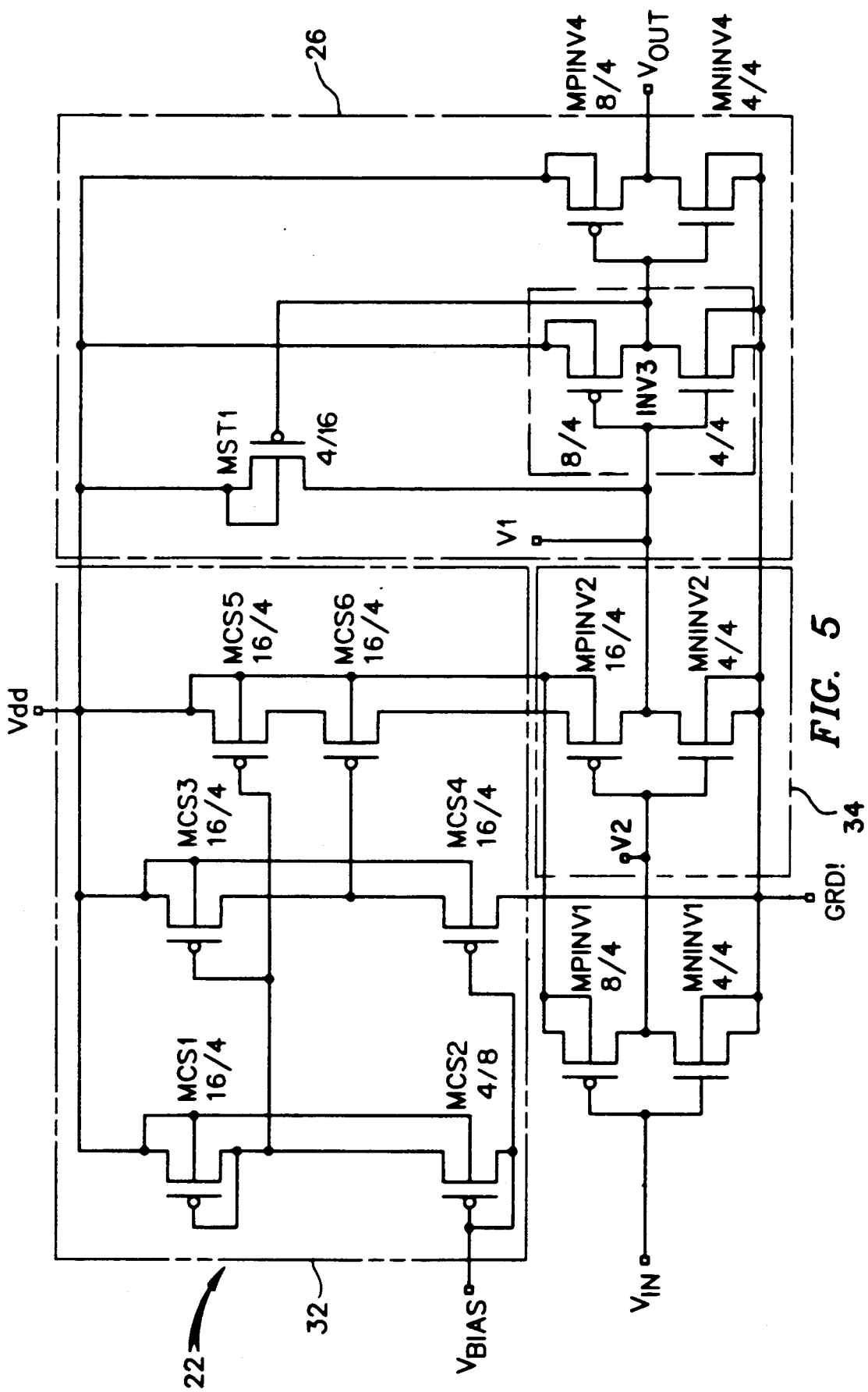
FIG. 5 is a device level schematic diagram of an adjustable rise time inverter and associated Schmitt trigger used in the preferred embodiment of FIG. 4.

FIG. 5 illustrates an adjustable rise time inverter 22 comprised of, a current source 32, an inverter 34, and a Schmitt trigger 26. $V_{BIAS}$ controls a current through MCS1 and MCS2. The current through MCS3 and MCS4 to ground is equal to the first current through MCS1 and MCS2. When an input ($V_{IN}$) goes high, V2 goes low and the PMOSFET (MPINV2) turns on, allowing the output current, equal to the current through MCS1 and MCS2, to flow through the MPINV2 to charge the capacitor formed by the gate capacitance $C_g$ of INV3. Thus, the output voltage rises proportional to the time of charging the capacitor.

The output current of the adjustable rise time inverter 22, at the test point V1, goes through MPINV2 to the $C_g$ of INV3 to charge it until the threshold voltage of INV3 is met. The output of inverter INV3 goes low. Then, MST1 is turned on, allowing the current to flow through it. Then, the signal at V1 is pulled up rapidly to the $V_{DD}$ level and $V_{OUT}$ becomes a sharp positive edge.

In the present embodiment, Table 1 indicates a delay time for each $V_{BIAS}$ from 0 to 6.4 volts for the adjustable rise time inverter and Schmitt trigger only. The range of the time delay is 4.5 ns to 111 ns.

TABLE 1

| $V_{BIAS}$ (VOLTS) | T(IN) (NS) | T(OUT) (NS) | T(DELAY) (NS) |
| --- | --- | --- | --- |
| 0.0 | 7.5 | 12.0 | 4.5 |
| 1.0 | 7.5 | 12.5 | 5.0 |
| 2.0 | 7.5 | 14.0 | 6.5 |

TABLE 1-continued

| $V_{BIAS}$ (VOLTS) | T(IN) (NS) | T(OUT) (NS) | T(DELAY) (NS) |
| --- | --- | --- | --- |
| 3.0 | 7.5 | 16.5 | 9.0 |
| 4.0 | 7.5 | 21.5 | 14.0 |
| 5.0 | 7.5 | 33.0 | 25.5 |
| 5.2 | 7.5 | 36.5 | 29.0 |
| 5.4 | 7.5 | 42.0 | 34.5 |
| 5.6 | 7.5 | 48.5 | 41.0 |
| 5.8 | 7.5 | 57.5 | 50.0 |
| 6.0 | 7.5 | 70.5 | 63.0 |
| 6.1 | 7.5 | 78.5 | 71.0 |
| 6.2 | 7.5 | 90.0 | 82.0 |
| 6.3 | 7.5 | 102.5 | 98.0 |
| 6.4 | 7.5 | 119.0 | 111.0 |

TABLE 2

| (FOR POSITION) VBIAS1 (VOLTS) | (FOR WIDTH) BVIAS2 (VOLTS) | t1 (ns) | t2 (ns) | t(delay) (ns) | t(width) (ns) |
| --- | --- | --- | --- | --- | --- |
| 0 | 0 | 12.9 | 18.5 | 5.5 | 5.6 |
| 2 | 0 | 15.3 | 20.7 | 7.8 | 5.4 |
| 4 | 0 | 22.8 | 28.4 | 15.3 | 5.6 |
| 6 | 0 | 71.5 | 76.9 | 64.0 | 5.4 |
| 0 | 2 | 13.0 | 20.6 | 5.5 | 7.6 |
| 0 | 4 | 13.0 | 27.8 | 5.5 | 14.8 |
| 0 | 6 | 13.0 | 74.8 | 5.5 | 61.8 |
| 2 | 2 | 15.2 | 23.0 | 7.7 | 7.8 |
| 2 | 4 | 15.2 | 30.2 | 7.7 | 15.0 |
| 2 | 6 | 15.2 | 80.0 | 7.7 | 64.8 |
| 4 | 2 | 22.9 | 30.5 | 15.4 | 7.6 |
| 4 | 4 | 22.9 | 37.8 | 15.4 | 14.9 |
| 4 | 6 | 22.9 | 85.4 | 15.4 | 62.5 |
| 6 | 2 | 71.5 | 79.0 | 64.0 | 7.5 |
| 6 | 4 | 71.5 | 86.3 | 64.0 | 14.8 |
| 6 | 6 | 71.5 | 133.2 | 64.0 | 61.7 |

Figure 6:
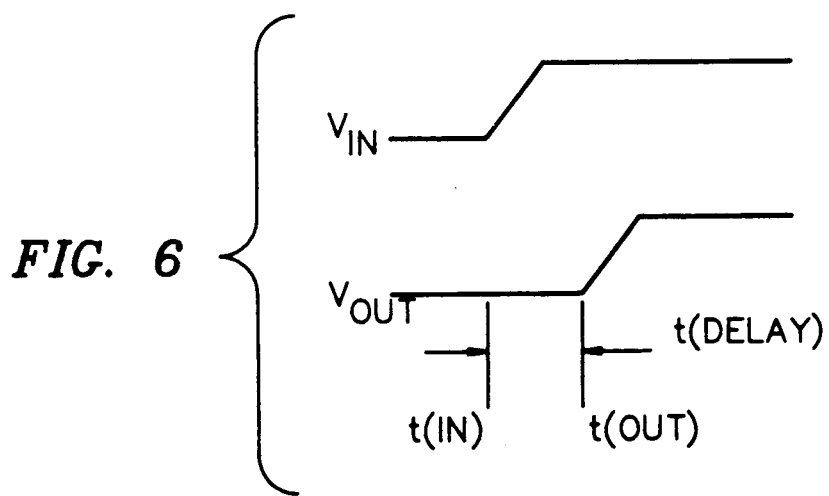
FIG. 6 illustrates the time delay values between the input signal and the output signal.

FIG. 6 illustrates the voltages VIN and VOUT. Table 2 shows the results for 16 different combinations $V_{BIAS}1$ and $V_{BIAS}2$ for the clock generator of FIG. 4.

Figure 7:
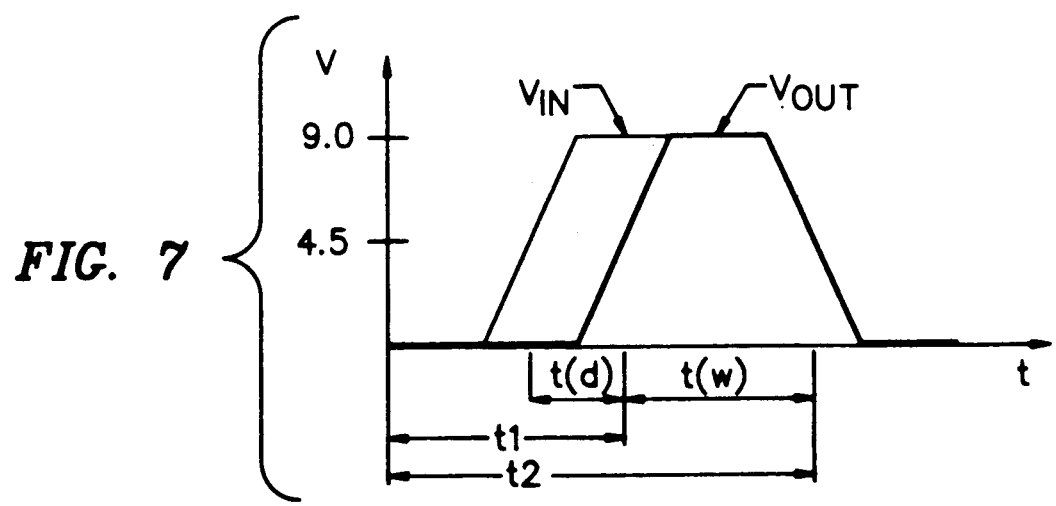
FIG. 7 illustrates the pulse width range values between the input signal and the output signal.

FIG. 7 provides the meaning for the times t shown in Table 2.

While there has been shown what are considered to be the preferred embodiments of the invention, it will be manifest that many changes and modifications may be made therein without departing from the essential spirit of the invention. It is intended, therefore, in the annexed claims, to cover all such changes and modifications as may fall within the true scope of the invention.

We claim:

1. An adjustable clock generator circuit comprising:
   flip-flop means having a clock input, a clear input, and complementary outputs comprising:
   first adjustable rise time inverter means having a first input for receiving a phasing input signal, a second input for receiving a first bias voltage for controlling the rise time of its output signal, and an output for providing a first output signal;
   first trigger means having an input connected to the output of said first adjustable rise time inverter and an output connected to the clock input of said flip-flop means and responsive to said first output signal for providing a pulse transition when said first output signal reaches a trigger voltage;
   second adjustable rise time inverter means having a first input connected to one output of said flip-flop means and a second input connected to a second bias voltage and an output for providing a second output signal having a rise time controlled by the second bias voltage;

second trigger means having an input connected to the output of said second adjustable rise time inverter means and an output connected to the clear input of said flip-flop means for providing a signal transition when said second output signal reaches a trigger voltage, thereby causing signals to appear on the complementary outputs of said flip-flop means with said signals having a pulse position controlled by the level of said first bias voltage and a width controlled by the level of said second bias voltage.

2. The adjustable clock generator circuit according to claim 1 and further comprising:

first inverter means interposed between the first input to said first adjustable rise time inverter means and said received phasing input signal.

3. The adjustable clock generator circuit according to claim 2 and further comprising:

second inverter means interposed between said one complementary output of said flip-flop and the input to said second adjustable rise time inverter; and third inverter means interposed between the output of said second trigger means and the clear input of said flip-flop means.

4. The adjustable clock generator circuit of claim 1 wherein said flip-flop is a D-type flip-flop.

* * * * *